United States Patent
Takekuma

(10) Patent No.: US 6,850,001 B2
(45) Date of Patent: Feb. 1, 2005

(54) LIGHT EMITTING DIODE

(75) Inventor: Akira Takekuma, Tokyo (JP)

(73) Assignee: Agilent Technologies, Inc., Palo Alto, CA (US)

(*) Notice: Subject to any disclaimer, the term of this patent is extended or adjusted under 35 U.S.C. 154(b) by 38 days.

(21) Appl. No.: 10/267,157

(22) Filed: Oct. 9, 2002

(65) Prior Publication Data

US 2003/0067264 A1 Apr. 10, 2003

(30) Foreign Application Priority Data

Oct. 9, 2001 (JP) ........................................ 2001-311899

(51) Int. Cl.[7] .............................. H05B 33/02; F21V 3/04
(52) U.S. Cl. ........................ 313/501; 313/512; 362/311; 362/800
(58) Field of Search .......................... 313/498, 501–503, 313/512, 478; 362/800, 311, 355, 310; 257/98–100

(56) References Cited

U.S. PATENT DOCUMENTS 5,998,925 A   12/1999   Shimizu et al. ............. 313/503
6,340,824 B1 *   1/2002   Komoto et al. ............... 257/99
2002/0175621 A1 * 11/2002   Song et al. .................. 313/515

FOREIGN PATENT DOCUMENTS

| JP | 08320656 | 12/1996 |
|---|---|---|
| JP | 10190065 | 7/1998 |
| JP | 10190066 | 7/1998 |
| JP | 11251640 | 9/1999 |
| WO | WO 96/14573 | 5/1996 |
| WO | WO 97/50132 | 12/1997 |
| WO | WO 98/12757 | 3/1998 |

* cited by examiner

*Primary Examiner*—Ashok Patel

(57) ABSTRACT

A light-emitting diode with no fluctuations in optical properties and good sealing properties, and a simple production method for producing this light-emitting diode. The light-emitting diode has a base comprising a cup part on which the light-emitting diode is placed, a resin material introduced into cup part, and a lens member placed on top of a cup for focusing light emitted by a light-emitting diode chip. A layer of fluorescent material, which converts the wavelength of at least some of the light from the light-emitting diode chip, is applied to the inner convex face of the lens member. When the lens member is attached to the base, the inner convex face deforms the resin material and air and excess resin material can be pushed to the outside.

3 Claims, 3 Drawing Sheets

(a)

(b)

(a)

(b)

LIGHT EMITTING DIODE

BACKGROUND OF THE INVENTION

1. Field of the Invention

The present invention pertains to a light-emitting diode, which is a light-emitting diode device comprising a light-emitting diode chip, particularly with which at least part of the light is converted in wavelength by a fluorescent material, making it possible to produce emission in a color that is different from the emission color of the light-emitting diode chip, for instance, white.

2. Description of the Related Art

A conventional example of a light-emitting diode of this type is described, for instance, in Japanese Patent Publication No. 8(1996)-320,656 and Japanese Patent Publication No. 11(1999)-251,640. According to the former document, the light-emitting diode device has a printed wiring board and a mask plate made of rubber or resin on top of this, and part of this mask plate comprises a cup that reflects light. The light-emitting diode chip is mounted on the inside of this cup. Light-transmitting filler is introduced and hardened inside the cup. Moreover, a lens plate of a pre-determined shape for focusing the light that has been emitted by the light-emitting diode is joined to the top of the mask plate.

A problem with this type of light-emitting diode is that a clearance or gap can be formed when air makes its way in between the lens plate and the filler and therefore, the luminous efficacy drops due to the effect of this air layer. It is all but impossible to eliminate the air layer when filler is introduced onto such a small surface area inside a cup and the lens plate is placed on top during the production process.

In order to eliminate this type of air layer, for instance, it is possible to further apply another filler over the first filler and form this into a lens shape. Nevertheless, as shown by the latter of the above-mentioned Patent Publications, using this type of process complicates production process and increases the cost of the product.

Moreover, another problem exists relating to wavelength conversion by the fluorescent material. According to the technique shown in the above-mentioned latter Patent Publication, a structure is used with which the emission from the light-emitting diode chip can be converted in wavelength. By means of the structure described in this patent, the resin material placed around the light-emitting diode chip contains a fluorescent material and this displays a color other than the original emission of the light-emitting diode chip when the emission from the light-emitting diode is converted in wavelength.

Nevertheless, this structure can produce irregularities in the light that is radiated to the outside due to the effect of differences in optical light paths emitted in each direction from the light-emitting diode chip, or a difference in the distribution of the fluorescent material. Moreover, fluctuations in the emission color between products are relatively large and there are cases in which these cause inconveniences, depending on the purpose for which the product is used.

SUMMARY OF THE INVENTION

Consequently, the present invention presents a light-emitting diode having a relatively simple structure but with which optical properties (uniformity of color, flux distribution properties) are good, there are no fluctuations in emission color between products, and efficient emission performance is obtained, as well as a method for producing this light-emitting diode. Yet another object of the present invention is to present a high-performance light-emitting diode as previously described by a relatively simple and inexpensive production process.

The light-emitting diode of the present invention has a light-emitting diode chip, a base that holds this chip and a lens for focusing the emission from the light-emitting diode chip. The base has a wiring pattern for electrically connecting the light-emitting diode. The wiring pattern is formed by a method such as printing, etc., along the surface of this base and an electrical path is formed between the light-emitting diode chip and outside devices. This base is a single component and has a cup part that is concave in shape. The wiring pattern extends to inside the cup part and the light-emitting diode chip is mounted inside the cup part.

The lens member has an inner convex face at almost the center on the side facing the base, a cup engagement face formed along the periphery of this inner convex face, and a shoulder for engaging with this base. When the lens member is placed on top of this base, the cup engagement face and the cup part engage and the inner convex face is aligned at the proper position on the base.

A fluorescent material is applied to the surface of the convex inner face. Various printing or application methods used in the past can be employed for this application. By means of these methods, the thickness and the amount of the fluorescent material layer can be controlled and therefore, stable emission performance of the assembled light-emitting diode can be guaranteed.

Resin material is introduced inside the cup part prior to the process, whereby the lens member is attached to this base. Only a pre-determined amount of resin material is introduced into the cup, but there can be some variation in the amount that is introduced between products, particularly when multiple products are being produced. Then, when the lens member is attached, the inner convex face comes into contact with the resin material, pushing this resin material, and as a result, the resin material is deformed and part of it is moved. The lens member has a groove extending from the position of the inner convex face toward the outer rim and when the lens member engages with the cup part, some of the resin material is pushed to the convex inner face and moves so that it makes its way into this groove. Thus, the clearance into which air makes its way is not made between the convex inner face and the resin material and consequently, light from the light-emitting diode is not reflected at the interface between the convex inner face and resin material and luminous efficacy is improved.

BRIEF DESCRIPTION OF THE DRAWINGS

FIG. 1(a) is a cross section of the assembled state, and FIG. 1(b) is a cross section showing the state sometime during the assembly process;

FIG. 3(a) is a cross section of the assembled state, and FIG. 3(b) is a cross section showing the state sometime during the assembly process.

DETAILED DESCRIPTION OF THE PREFERRED EMBODIMENT

Figure 1:
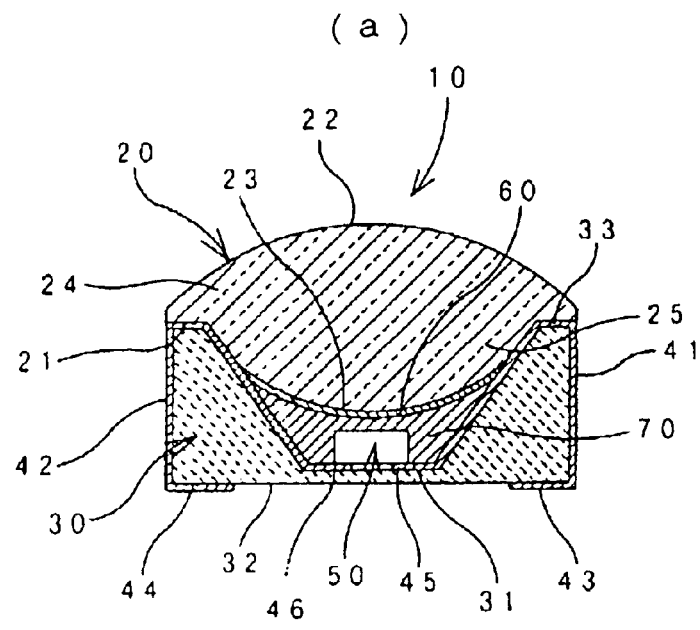
FIG. 1 shows a first preferred embodiment of the light-emitting diode of the present invention where
Figure 1:
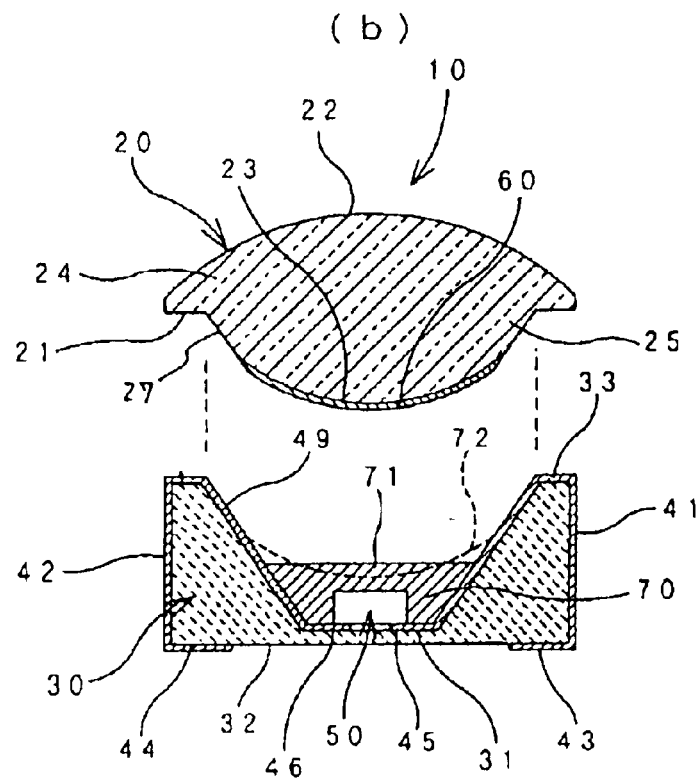
Figure 2:
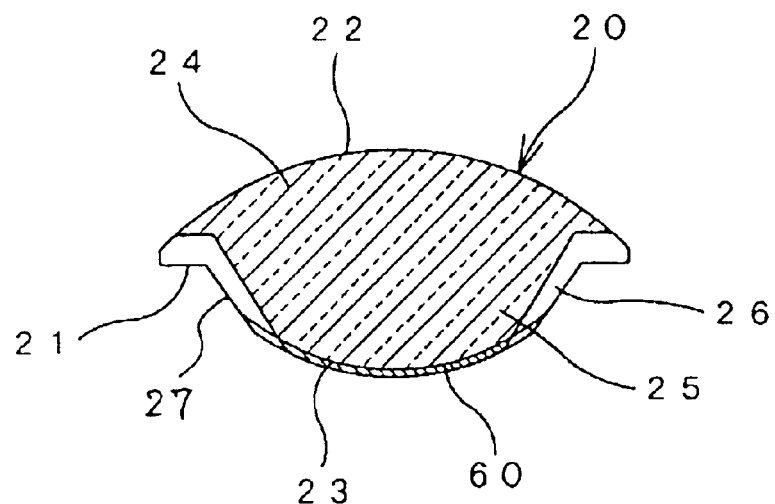
FIG. 2(a) is a cross section of the lens member at a position along line A—A in FIG. 2(b)
FIG. 2(b) is a bottom view of the lens member of the present invention.
Figure 2:
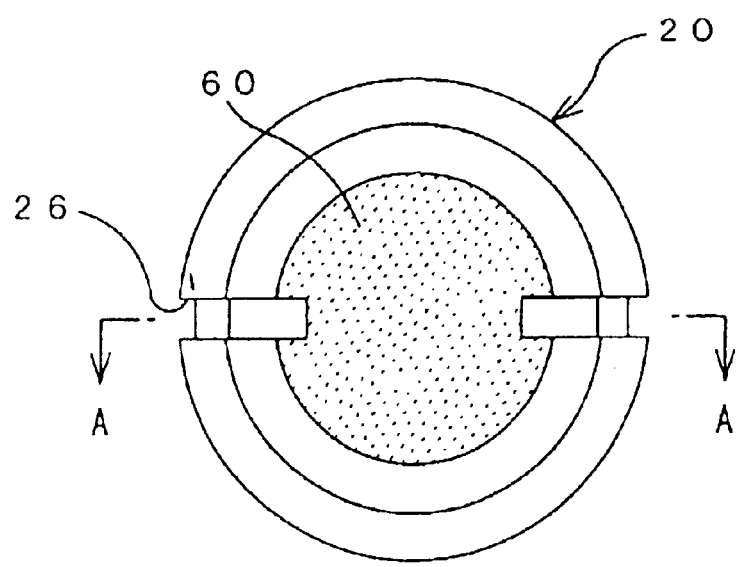

Light-emitting diodes and methods for their production that are preferred embodiments of the present invention will now be described in detail while referring to the attached drawings. FIG. 1 is a cross-section describing the light-emitting diode that is the first preferred embodiment of the present invention, with (a) showing the state when assembly is completed and (b) showing this state before assembly. FIG. 2 is a Fig. showing the structure of the lens member used in the light-emitting diode that is the first preferred embodiment. (a) is a bottom view and (b) is a cross-section along line A—A in (a).

Light-emitting diode 10, which is the first preferred embodiment, has light-emitting diode chip 50, base 30 that holds this chip, and lens member 20 set up on base 30. base 30 comprises cup part 31 with a concave structure, and light-emitting diode chip 50 is held and mounted inside this cup. Base 30 is worked into a pre-determined shape by grinding a ceramic material or molding a plastic, etc. Wirings 41 and 42 are formed on the surface of base 30 by conventional methods. One end of both wirings 41 and 42 extends to inside cup part 31 and chip connecting parts 45 and 46 for electrical connection to light-emitting diode chip 50 are made in this cup part. For instance, base 30 can be made by working a glass-epoxide base into a cup shape and forming wiring on this base using copper foil. Moreover in a different case, it is possible to mold plastic or ceramic into a cup shape to make base 30 and form the electrical wiring on the surface of this base by an MID (Molded Interconnect Device) means.

Furthermore, by means of another embodiment that is not illustrated, base 30 can also be formed with the majority of this base as a metal block. In this case, an insulating layer for electrically insulating the metal block and the wiring is made where needed by coating with resin, affixing insulating film, mechanical assembly with insulation parts, etc., in order to produce the electrical wiring for actuating light-emitting diode chip 50. That is, wiring can be formed on these insulation layers. When the majority of base 30 is made from metal, the heat that is generated when light-emitting diode chip 50 is actuated can efficiently escape to other devices or other parts on which the light-emitting diode is mounted and stability of operation of the light-emitting diode can be guaranteed.

Wirings 41 and 42 extend from chip connection parts 45 and 46 along the inner surface of cup part 31 on which light-emitting diode chip 50 is mounted and further extend through the side surface to bottom face 32 of base 30. Mounting parts 43 and 44 for mounting the light-emitting diode on another circuit base (not illustrated) are placed on base face 32. That is, light-emitting diode chip 50 mounted inside cup part 31 is connected to another circuit base by wirings 41 and 42. Furthermore, light-emitting diode chip 50 can be mounted inside cup part 31 by a method such as by wirebonding, or "flip-chip" or "flop-chip" mounting, etc.

As illustrated, lens member 20 is placed on base 30. Lens member 20 has outer convex part 24 and inner convex part 25. The curvature of surface (outer convex surface) 22 of outer convex part 24 and surface (inner convex surface) 23 of inner convex part 25 is designed so that the necessary convergence of light is obtained at the light-emitting diode. Outer convex part 24 is formed to a larger diameter than inner convex part 25 and shoulder 21 is thereby demarcated along the outer periphery. As shown in the FIG. 1, when lens member 20 is attached to base 30, surface 23 of the inner convex part 25 is placed adjacent to light-emitting diode chip 50.

Fluorescent material 60 is coated onto surface 23 of the inner convex part 25 of lens member 20. Consequently, when light-emitting diode chip 50 is actuated, the light that has been emitted is reflected up at cup part 31 and at least some of this light is converted in wavelength as outgoing light by fluorescent material 60. Resin material or chip coating material 70 is filled inside the space made by surface 23 and cup part 31. Resin material 70 has the effect of adhering and anchoring lens member 20 and eliminating the air layer and preventing deterioration of light-emitting diode chip 50. A transparent material that absorbs little of the emitted light is selected for resin material 70. When necessary, a diffusing substance that diffuses light from the light-emitting diode chip is mixed with resin material 70. Moreover, luminous efficacy from the chip can be increased by using a material with a high index of refraction as fluorescent material 70, and a structure wherein no stress is applied to the mounted chip or the wires for bonding connection can be produced by selecting a material having sufficient elasticity when it hardens, etc.

Next, the method of producing light-emitting diode 10 will be explained while describing the shape of lens member 20. A base view of lens member 20 is shown in FIG. 2(b) and the cross-section of the position along the A—A line in (b) is shown in FIG. 2(a).

This general shape of lens member 20 is as previously described and overall it is the shape of a mushroom. It is usually made from a transparent resin, but it can also be formed from another material such as glass, etc. Inclined face 28 is provided between shoulder 21 and surface 23. Part of inner convex part 25 near inclined face 28 is a circular truncated cone shape that is almost complementary to concave cup shape 31, and surface 23 comprises a dome-shaped part so that it overlaps this circular truncated cone. Furthermore, as shown in FIG. 2, lens member 20 has a pair of grooves 26 in opposing positions. Grooves 26 extend from the position of surface 23 of inner convex part 25 to the position of shoulder 21 and reach up to the position of surface 22 of outer convex part 24.

As described above, fluorescent material 60 for color conversion is positioned at surface 23 of les member 20. According to the present embodiment, a ceramic material such as YAG:Ce, etc., or other organic fluorescent materials can be used as the fluorescent material for white emission by using the light-emitting diode.

As shown in FIG. 1(b), light-emitting diode chip 50 is mounted inside base 30 before assembling lens member 20 on base 30. As shown in FIG. 1(b), light-emitting diode chip 50 is mounted at the base of cup part 31 and resin material 70 is introduced from above this chip. Resin material 70 has sufficient fluidity. The surface of the resin material before setting up lens member 20 is represented by reference 71. Resin material 70 is introduced at a relatively large volume and the excess portion is removed during the process of setting up lens member 21. This will be discussed below.

The setting up of lens member 20 will be explained as the transition from FIG. 1(b) to (a). That is, when lens member 20 is combined with base 30 onto which resin material 70 has been introduced, inner convex part 25 makes its way into cup part 31. As is clear from FIG. 1(a), lens member 20 is placed at a position where shoulder 21 almost touches top face 33 of base 30 (or wiring 41 formed on top of this top face), or at a position where inclined face 27 almost touches the inner surface of cup part 31. However, inner convex part 25 projects by a sufficient amount from the position of shoulder 21 and therefore, surface 23 onto which fluorescent material 60 has been applied first comes into contact with resin material 70 during the course of setting up lens member 20.

When lens member 20 further pushes down toward base 30 from this position, surface 23 pushes and deforms resin material 70. Resin material 70 has sufficient fluidity and therefore when lens member 20 pushes up, resin material 70 flows into groove 26 formed in lens member 20. As previously mentioned, groove 26 reaches up to the side end position of surface 22 along the side rim of lens member 20 and therefore, resin material 70 that has been pushed out by movement of lens member 20 can be moved toward the outside through groove 26. It should be notable that, in this case, surface 23 of lens member 20 gradually approaches resin material 70 from its central position. On the other hand, while groove 26 is provided at the side end of lens member 20. Therefore, air that was present inside cup part 31 before lens member 20 was set up can be released to the outside through groove 26 together with excess resin material. As a result, resin material 70 adheres closely to layer 60 of fluorescent material that has been applied to surface 23 of lens member 20 (referred to surface 72 of resin material 70 represented by the broken line with reference 72 in FIGS. 1(a) and (b)), so that it is possible to eliminate the clearance where air makes its way into the space demarcated by the layer of fluorescent material 60 and cup part 31. Consequently, it is possible to obtain good sealing properties.

The first advantage of this structure is that the position of the fluorescent material can be precisely determined and the amount can also be controlled and as a result, it is possible to reliably control the optical properties of the light-emitting diode and guarantee good optical properties of the light-emitting diode. For instance, white emission is obtained by applying to the bottom of the lens a fluorescent material that emits yellow to the light of the light-emitting diode chip when the light-emitting diode chip is a blue-emitting diode, but in the past, the fluorescent material has been placed in a variety of positions, such as over the entire inside of the cup, all or part of the molding resin, inside the chip coating layer, the outer layer of the molding resin, etc. with this type of light-emitting diode. According to the present invention, as much fluorescent material 60 as needed can be placed in the desired shape at the bottom of lens member 20 and fluorescent material can also be precisely placed at the appropriate position close to the chip. Thus, the light directly from the chip and the light reflected by the cup can be uniform light with no color irregularities. This is particularly effective in the use of white emission for lighting, etc. Moreover, the difference between products is also small and a high product property standard can be guaranteed, even with mass production.

A second advantage is that because the conventional sealing with molding resin is not necessary with the method for producing a light-emitting diode of the present invention, time-consuming processes that use high-temperature ovens are not necessary and the production process can be simplified. That is, it is possible to simplify the production process and to present a product of improved balanced performance, which is very effective for the mass production of light-emitting diodes. Moreover, it is possible to simultaneously produce a large number of products by the production method of the present invention where a large base in which many cup parts have been formed and lenses that have been molded into a plate shape are combined and then divided into units. In particular, it should be noted that even when many products are to be produced, the lens is precisely positioned with respect to the base and high-performance products can be guaranteed.

Figure 3:
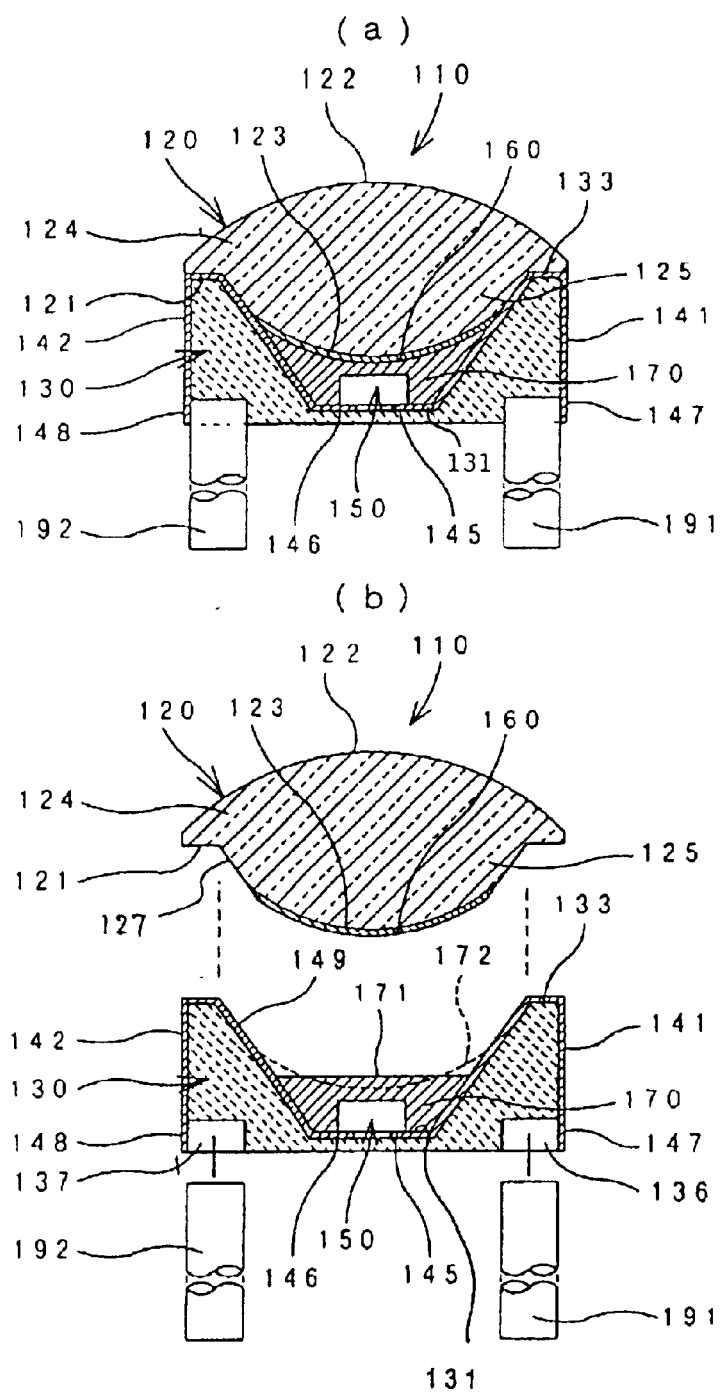
FIG. 3 shows a second preferred embodiment of the light-emitting diode of the present invention where

FIG. 3 shows the light-emitting diode that is the second preferred embodiment of the present invention. Cross sections similar to FIGS. 1(a) and (b) are shown in (a) and (b), respectively. Each element forming the basic structure of the present invention in light-emitting diode 110 of the second embodiment is the same as light-emitting diode 10 of the first embodiment and therefore, they are shown by adding 100 to the reference numerals and therefore, a description of their effect and result is omitted.

The difference between light-emitting diode 110 of the present embodiment and light-emitting diode 10 of the first embodiment is the structure of base 131 and the use of leads 191 and 192. This difference is due to the fact that light-emitting diode 10 of the first embodiment is surface mounted to another device that is not illustrated and light-emitting diode 110 of the second embodiment is mounted using throughholes in a circuit board, etc.

Light-emitting diode 110 has base 130 for holding light-emitting diode chip 150 and lens member 20 that is set up on the base 130. Production of base 130, mounting of light-emitting diode chip 150 on base 130, application of fluorescent material 160 to lens member 120, and setting up of lens member 120 on base 130 are performed in the same order as in the first embodiment. By means of the second embodiment, lens member 120 is set up on base 130 so that it pushes resin material 170 and an assembly of a light-emitting diode having good sealing performance is thereby produced.

Leads 191 and 192 can be set up after the process of assembly of base 130 and lens member 120, or during the process where base 130 is produced, but the former procedure is more preferable when total production process is considered. This is because by means of the former method, for instance, many light-emitting diodes can be assembled at once as previously mentioned, and because operating tests can be performed before attaching leads 191 and 192 to base 130 after light-emitting diode chip 150 has been mounted onto base 130.

The light-emitting diodes that are the preferred embodiments of the present invention have been described in detail above, but they are simply examples. The present invention is not restricted to these examples and various changes and modifications by persons of skilled in the art are possible.

When the present invention is described in accordance with the above-mentioned preferred embodiments, the present invention presents light-emitting diodes 10 and 110, characterized in that in light-emitting diode devices 10 and 110 which have light-emitting diode chips 50 and 150, bases 30 and 130 comprising cup parts 31 and 131 in which above-mentioned light-emitting diode chips 50 and 150 are placed, resin materials 70 and 170 introduced inside above-mentioned cup parts 31 and 131, and lens members 20 and 120 placed on top of above-mentioned cup parts 31 and 131 for focusing the emission from above-mentioned light-emitting diode chips 50 and 150, and on part of which is applied fluorescent materials 60 and 160, so that at least some of the emission from light-emitting diode chips 50 and 150 is converted in wavelength by above-mentioned fluorescent materials 60 and 160, above-mentioned lens members 20 and 120 project out toward above-mentioned light-emitting diode chips 50 and 150 into above-mentioned cup parts 31 and 131 and have inner convex faces 23 and 123 that adhere closely without any clearance with above-mentioned resin material materials 70 and 170 at least around above-mentioned light-emitting diode chips 50 and 150, and above-mentioned fluorescent materials 60 and 160 are applied over above-mentioned inner convex faces 23 and 123.

Preferably above-mentioned lens members 20 and 120 have shoulder parts 21 and 121 for engaging with above-mentioned cup parts 31 and 131 along the outer rim.

Preferably, resin materials 70 and 170 are placed inside above-mentioned cup parts 31 and 131 and above-mentioned resin materials 70 and 170 are introduced without any clearance in the space demarcated by above-mentioned inner convex faces 23 and 123 or fluorescent materials 60 and 160 applied to these inner convex faces and above-mentioned cup parts 31 and 131.

Preferably, above-mentioned lens members 20 and 120 have engagement faces 28 and 128 that engage with part of the inner face of above-mentioned cup parts 31 and 131 between above-mentioned inner convex faces 23 and 123 and above-mentioned shoulders 21 and 121.

Preferably, above-mentioned shoulder parts 21 and 121 of lens members 20 and 120 have grooves 26 and 126 extending from a position on above-mentioned inner convex faces 23 and 125 to the outer rim through which some of above-mentioned resin materials 70 and 170 can pass when above-mentioned lens members 20 and 120 are engaged with above-mentioned bases 30 and 130.

Furthermore, the present invention presents a method of producing a light-emitting diode, characterized in that it comprises the process whereby light-emitting diode chips 50 and 150 are mounted and placed inside cup parts 31 and 131 on bases 30 and 130, the process whereby lens members 20 and 120 having inner convex faces 23 and 123 and which engage with above-mentioned bases 30 and 130 are formed, the process whereby fluorescent materials 60 and 160 are applied over above-mentioned inner convex faces 23 and 123, the process whereby resin materials 70 and 170 are introduced in above-mentioned cup parts 31 and 131, and the process whereby above-mentioned lens members 20 and 120 onto which the above-mentioned fluorescent materials have been applied are set up on above-mentioned bases 30 and 130 and above-mentioned resin materials 70 and 170 are pushed by above-mentioned inner convex faces 23 and 123 resulting in part of the above-mentioned resin material being deformed and moved.

Preferably, above-mentioned lens members 20 and 120 have engagement faces 27 and 127 that engage with part of the inner face of above-mentioned cup parts 31 and 131 at a position along the rim of the outer end of above-mentioned inner convex faces 23 and 123 and when above-mentioned lens members 20 and 120 are set up, above-mentioned t lens members 20 and 120 are aligned as a result of engagement between above-mentioned engagement faces 27 and 127 and above-mentioned cup parts 31 and 131.

Preferably, above-mentioned lens members 20 and 120 have grooves 26 and 126 extending from a position on above-mentioned inner convex faces 23 and 125 to the outer rim such that when above-mentioned lens members 20 and 120 are set up on above-mentioned bases 30 and 130, some of the above-mentioned resin materials 70 and 170 makes its way into above-mentioned grooves 26 and 126.

What is claimed is:

1. A light-emitting diode, comprising:
   a light-emitting diode chip;
   a base with a cup part in which said light-emitting diode chip is placed;
   a resin material introduced inside said cup part;
   a lens member pre-formed and placed on top of said cup part for focusing an emission from said light-emitting diode chip, said lens member projecting out toward said light-emitting diode chip into said cup part and having an inner convex face and having a shoulder part for engaging with said base along an outer rim thereof; and
   a fluorescent material applied at least partially over said inner convex face for converting a wavelength of at least some of said emission from said light-emitting diode chip, wherein said inner convex face adheres closely, without any clearance, with said resin material at least around said light-emitting diode chip.

2. The light-emitting diode in claim 1, further comprising a resin material placed inside said cup, wherein said resin material is filled without any clearance in the space demarcated by said inner convex face or said fluorescent material applied to said inner convex face and said cup part.

3. The light-emitting diode in claim 1, wherein said shoulder part is located at a position along a rim of an outer end of said inner convex face.

* * * * *